US008652933B2

(12) United States Patent
Parries et al.

(10) Patent No.: US 8,652,933 B2
(45) Date of Patent: Feb. 18, 2014

(54) SEMICONDUCTOR STRUCTURE HAVING WIDE AND NARROW DEEP TRENCHES WITH DIFFERENT MATERIALS

(75) Inventors: Paul C. Parries, Wappingers Falls, NY (US); Yanli Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 12/943,973

(22) Filed: Nov. 11, 2010

(65) Prior Publication Data

US 2012/0122303 A1 May 17, 2012

(51) Int. Cl.
*H01L 21/76* (2006.01)

(52) U.S. Cl.
USPC ..... 438/427; 438/430; 438/437; 257/E21.548

(58) Field of Classification Search
USPC .................. 438/427, 430, 437; 257/E21.548
See application file for complete search history.

(56) References Cited

U.S. PATENT DOCUMENTS

| | | | |
|---|---|---|---|
| 6,566,228 B1 | 5/2003 | Beintner | |
| 6,991,993 B2 | 1/2006 | Park et al. | |
| 7,060,573 B2 | 6/2006 | Lim et al. | |
| 7,067,388 B1 | 6/2006 | Hui et al. | |
| 7,208,390 B2 | 4/2007 | Singh et al. | |
| 7,468,307 B2 * | 12/2008 | Hartner et al. | 438/430 |
| 8,008,163 B2 * | 8/2011 | Jang et al. | 438/424 |
| 2003/0122215 A1 * | 7/2003 | Wilson | 257/520 |
| 2005/0079730 A1 * | 4/2005 | Beintner et al. | 438/758 |
| 2008/0164517 A1 * | 7/2008 | Ohta et al. | 257/330 |
| 2008/0283960 A1 * | 11/2008 | Lerner | 257/508 |
| 2009/0020847 A1 | 1/2009 | Byun et al. | |
| 2009/0215242 A1 * | 8/2009 | Nitta | 438/427 |
| 2010/0084707 A1 | 4/2010 | Wang et al. | |
| 2011/0057259 A1 * | 3/2011 | Li | 257/333 |

FOREIGN PATENT DOCUMENTS

JP 2000012678 1/2000

* cited by examiner

*Primary Examiner* — Charles Garber
*Assistant Examiner* — Ron Pompey
(74) *Attorney, Agent, or Firm* — Ira D. Blecker; Ian D. MacKinnon

(57) ABSTRACT

Disclosed is a method of forming a semiconductor device structure in a semiconductor layer. The method includes forming a first trench of a first width and a second trench of a second width in the semiconductor layer; depositing a layer of first material which conforms to a wall of the first trench but does not fill it and which fills the second trench; removing the first material from the first trench, the first material remaining in the second trench; depositing a second material into and filling the first trench and over a top of the first material in the second trench; and uniformly removing the second material from the top of the first material in the second trench, wherein the first trench is filled with the second material and the second trench is filled with the first material and wherein the first material is different from the second material.

25 Claims, 5 Drawing Sheets

SEMICONDUCTOR STRUCTURE HAVING WIDE AND NARROW DEEP TRENCHES WITH DIFFERENT MATERIALS

BACKGROUND

The present invention relates to the field of semiconductor structures and, more particularly, relates to methods of forming semiconductor structures having different width trenches filled with different materials.

In semiconductor structures, there may be first deep trenches to separate different circuit regions. Some of these different circuit regions may also have second deep trenches for circuit design. Further, the first and second deep trenches may be of different widths.

BRIEF SUMMARY

The various advantages and purposes of the exemplary embodiments as described above and hereafter are achieved by providing, according to a first aspect of the exemplary embodiments, a method of forming a semiconductor device structure in a semiconductor layer. The method includes forming a first trench of a first width and a second trench of a second width in the semiconductor layer; depositing a layer of first material which conforms to a wall of the first trench but does not fill it and which fills the second trench; removing the first material from the first trench, the first material remaining in the second trench; depositing a second material into and filling the first trench and over a top of the first material in the second trench; and uniformly removing the second material from the top of the first material in the second trench, wherein the first trench is filled with the second material and the second trench is filled with the first material and wherein the first material is different from the second material.

According to a second aspect of the invention, there is provided a method of forming a semiconductor device structure in a semiconductor layer. The method includes forming a first trench of a first width and a second trench of a second width in the semiconductor layer; depositing a layer of polysilicon which conforms to a wall of the first trench but does not fill it and which fills the second trench; removing the polysilicon from the first trench, the polysilicon remaining in the second trench; depositing oxide into and filling the first trench and over a top of the polysilicon in the second trench; and uniformly removing the oxide from the top of the polysilicon in the second trench, wherein the first trench is filled with an oxide and the second trench is filled with polysilicon.

According to a third aspect of the invention, there is provided a method of forming a semiconductor device structure in a semiconductor layer. The method includes forming a semiconductor substrate having a semiconductor layer, a pad nitride layer and an oxide hard mask; forming a first trench of a first width and a second trench of a second width through the oxide hard mask and pad nitride and penetrating at least into the semiconductor layer; depositing a layer of polysilicon over the oxide hard mask and into the first trench and second trench, the polysilicon conforming to a wall of the first trench but not filling it and filling the second trench; removing the polysilicon from the first trench, the polysilicon remaining in the second trench; depositing oxide over the oxide hard mask and into and filling the first trench and over a top of the second trench; and uniformly removing the deposited oxide and stopping on the top of the polysilicon in the second trench, wherein the first trench is filled with an oxide and the second trench is filled with polysilicon.

According to a fourth aspect of the invention, there is provided a method of forming a semiconductor device structure in a semiconductor layer. The method includes forming a semiconductor substrate having a semiconductor layer, a pad nitride layer and an oxide hard mask; forming a first trench of a first width and a second trench of a second width through the oxide hard mask and pad nitride and penetrating at least into the semiconductor layer; depositing a conformal liner in the first trench and second trench; depositing a layer of polysilicon over the oxide hard mask and into the first trench and second trench, the polysilicon conforming to the liner of the first trench but not filling it and filling the second trench; removing the polysilicon from the first trench, the polysilicon remaining in the second trench; removing the liner from the first trench; depositing oxide over the oxide hard mask and into and filling the first trench and over a top of the second trench; and uniformly removing the deposited oxide and stopping on the top of the polysilicon in the second trench, wherein the first trench is filled with an oxide and the second trench is filled with polysilicon.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 9 are cross sectional views of a semiconductor structure made in accordance with an exemplary embodiment of the present invention in which:

FIG. 1 is a cross sectional view of the semiconductor structure after formation of a wide deep trench and a narrow deep trench;

FIG. 2 is a cross sectional view of the semiconductor structure after deposition of a liner and a first material;

FIG. 3 is a cross sectional view of the semiconductor structure after removing the first material from the wide deep trench;

FIG. 4 is a cross sectional view of the semiconductor structure after removing the liner from the wide deep trench;

FIG. 5 is a cross sectional view of the semiconductor structure after deposition of a second material over the semiconductor structure and filling the wide deep trench;

FIG. 6 is a cross sectional view of the semiconductor structure after planarizing;

FIG. 7 is a cross sectional view of the semiconductor structure after removing an oxide hard mask;

FIG. 8 is a cross sectional view of the semiconductor structure after recessing the liner and first material in the narrow deep trench; and FIG. 9 is a cross sectional view of the semiconductor structure after additional first material is deposited in the narrow deep trench.

DETAILED DESCRIPTION

Exemplary embodiments pertain to forming a narrow deep trench and, in addition, forming a wide deep trench. In exemplary embodiments, the wide deep trench may be adjacent to or next to the narrow deep trench. In other exemplary embodiments, the narrow deep trench may be part of a functional cell such as a transistor in an eDRAM cell and the wide deep trench may be spaced from the narrow deep trench. The narrow deep trench and wide deep trench are filled with different materials. One or both of the narrow deep trench and wide deep trench may have a liner prior to filling with the different materials. The liner is of a different material than either of the fill materials in the narrow deep trench and wide deep trench. More generally, the liner may be a filling material that is different than either of the fill materials in the narrow deep trench and wide deep trench.

In one exemplary embodiment to be described in detail hereafter, the first material filling the narrow deep trench is polysilicon and the second material filling the wide deep trench is an oxide. In this exemplary embodiment, the narrow deep trench is a device trench while the wide deep trench is an isolation trench to separate two devices or, more preferably, two circuit areas.

In general, a wide range of materials may be used for the first and second materials provided that they may be deposited by a chemical vapor deposition process and have high conformability when deposited. Some materials useful for the first material filling the narrow deep trench may be oxides, polysilicon and metals. Some materials useful for the second material filling the wide deep trench may also be oxides, polysilicon and metals. It is noted that the same variety of materials may be used for the first material filling the narrow deep trench and the second material filling the wide deep trench. However, while the variety of materials for the narrow and wide deep trenches may be the same, the same material should not be used at the same time for both the narrow and wide deep trenches. Some combinations of materials for the first material/second material, respectively, may be polysilicon/oxide, oxide/polysilicon, metal/oxide and oxide/metal.

Referring to the Figures in more detail, there is shown an exemplary embodiment wherein polysilicon is used as the first material for filling the narrow deep trench and an oxide is used as the second material for filling the wide deep trench. Other exemplary embodiments using the variety of materials mentioned herein would be made by a similar process.

Figure 1:
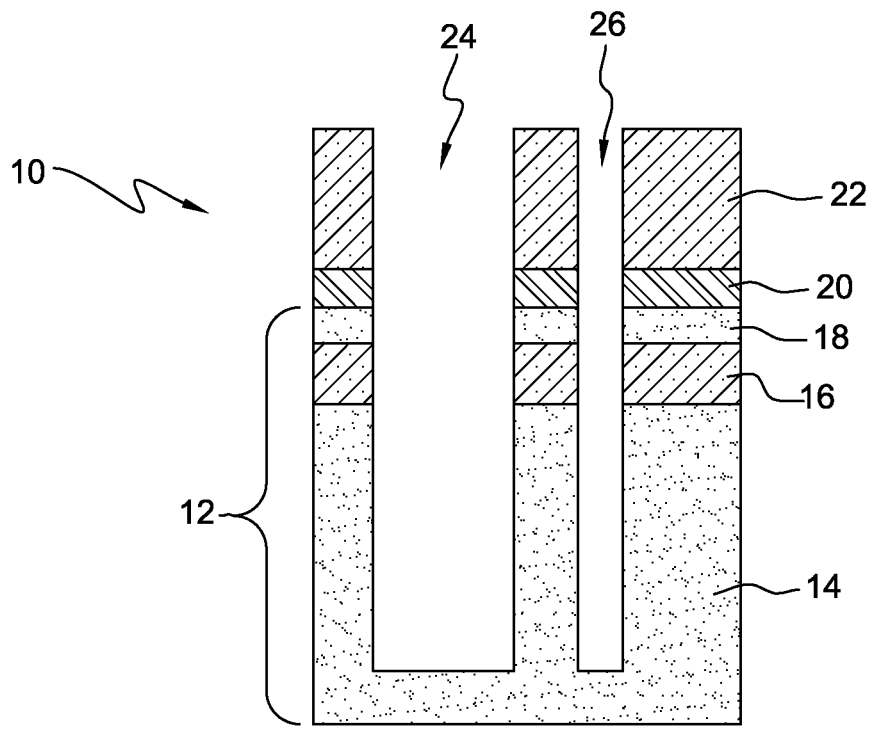

Referring now to FIG. 1, there is shown a semiconductor structure 10 in an exemplary embodiment. The semiconductor structure includes a semiconductor substrate 12, a pad nitride layer 20 and an oxide hard mask layer 22. The nitride for the pad nitride layer 20 may be silicon nitride. The oxide for the oxide hard mask layer may be silicon oxide. In an exemplary embodiment, semiconductor substrate 12 is a bulk semiconductor. In a preferred exemplary embodiment, semiconductor substrate 12 is a semiconductor on insulator (SOI) substrate which includes a semiconductor layer 18 on a buried oxide (BOX) layer 16. The SOI structure is typically built on a bulk semiconductor wafer 14.

The semiconductor material that makes up semiconductor substrate 12 if it is a bulk semiconductor may include but not be limited to group IV semiconductors such as silicon, silicon germanium or germanium, a III-V compound semiconductor, or a II-VI compound semiconductor. Similarly, in the preferred exemplary embodiment, semiconductor layer 18 and bulk semiconductor wafer 14 may include but not be limited to group IV semiconductors such as silicon, silicon germanium or germanium, a III-V compound semiconductor, or a II-VI compound semiconductor. Buried oxide layer 16 may be silicon oxide or other dielectric materials.

The remainder of the discussion will focus on the SOI structure shown in FIG. 1.

The semiconductor structure 10 has been patterned and etched to form first trench 24 and second trench 26. In an exemplary embodiment, first trench 24 and second trench 26 may be formed simultaneously for process simplification. In an exemplary embodiment, first trench 24 and second trench 26 may have the same depth extending into the bulk semiconductor wafer 14 as shown in FIG. 1. That first trench 24 and second trench 26 may have the depth is not a necessary aspect of the exemplary embodiments and in another exemplary embodiment, first trench 24 and second trench 26 may have different depths. In an exemplary embodiment, first trench 24 is wider, and sometimes substantially wider, than second trench 26. That is, first trench 24 should be at least ten percent (10%) wider than second trench 26 which should be sufficient to leave a gap in the center of the first trench 24 when the first trench 24 is conformally filled as described hereafter. In other exemplary embodiments, first trench 24 may be two or three times wider than second trench 26. Eventually, first trench 24 will be filled with an oxide to isolate circuit regions while second trench 26 will be filled with polysilicon and form a part of the circuit region.

Figure 2:
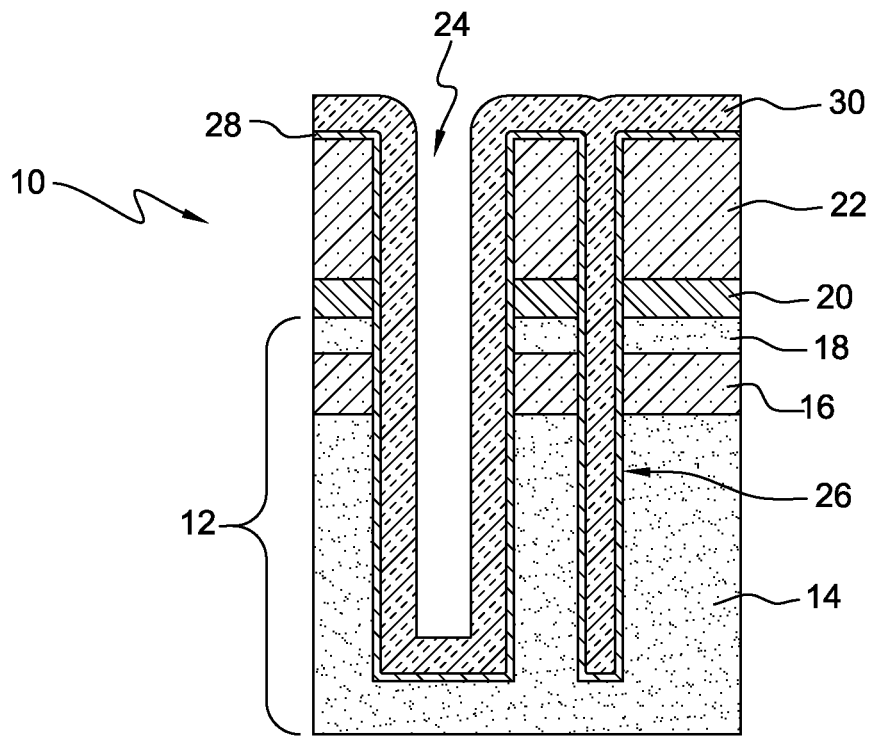

Referring now to FIG. 2, a liner 28 is conformally deposited along the walls of first trench 24 and second trench 26. Liner 28 may also be present on the top of the oxide hard mask 22. Liner 28 may include a first layer of high dielectric constant (high-k) material and a second layer of a metal. The high-k material and metal of liner 28 are conventional and may be, for example, hafnium oxide and titanium nitride, respectively. Other liner materials and other fill materials may be used for liner 28. The liner 28 may be deposited by a process such as chemical vapor deposition or atomic layer deposition. Thereafter, polysilicon 30 is conformally deposited by a process such as chemical vapor deposition. The polysilicon 30 entirely fills the second trench 26. However, the polysilicon 30 should not fill the entire first trench 24. Rather, the polysilicon 30 should only be present on the walls and bottom of the first trench 24 leaving a gap down the center of the trench 24.

Figure 3:
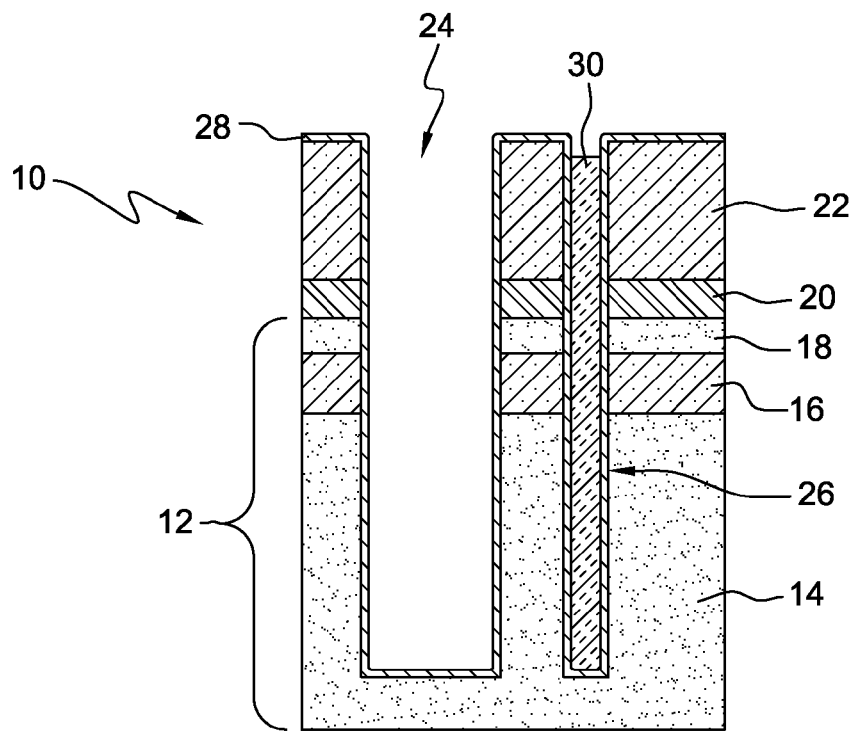

Referring now to FIG. 3, the semiconductor structure 10 undergoes an isotropic etch to remove the polysilicon 30 entirely from the first trench 24. The isotropic etch may be a dry etch such as isotropic reactive ion etching or a wet etch such as nitric acid plus hydrofluoric acid. As a result of the isotropic etch, the polysilicon 30 in the second trench 26 may be slightly recessed from the top of the oxide hard mask.

Figure 4:
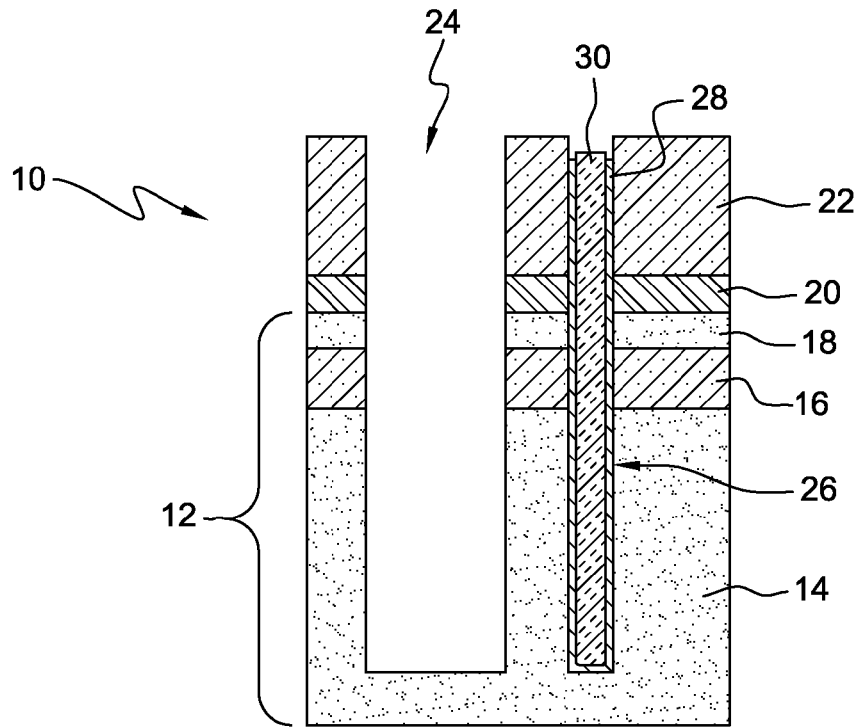

Thereafter, the liner 28 is stripped wherever it is exposed as shown in FIG. 4. A dual etch may be required due to their being two different materials in the liner 28 in an exemplary embodiment. First, a wet etch, such as sulfuric acid plus hydrogen peroxide, is used to remove the metal from the liner 28 followed by a dry etch, such as isotropic reactive ion etching, to remove the high-k layer from the liner 28. Thus, the liner 28 is removed entirely from the first trench 24 and from the top of the oxide hard mask 22. The liner 28 may also be slightly recessed with respect to the polysilicon in the second trench 26.

Figure 5:
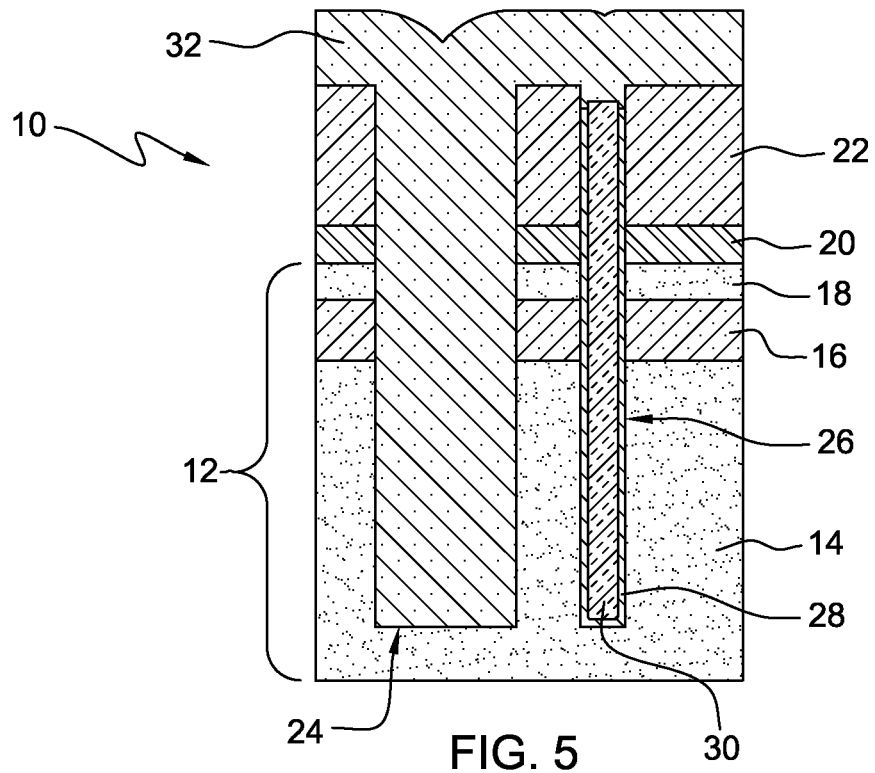

Oxide fill 32, such as silicon oxide, is deposited, for example by chemical vapor deposition, over the semiconductor structure 10 and particularly into first trench 24 as shown in FIG. 5. This oxide fill 32 will form an additional oxide layer over oxide hard mask 22.

Figure 6:
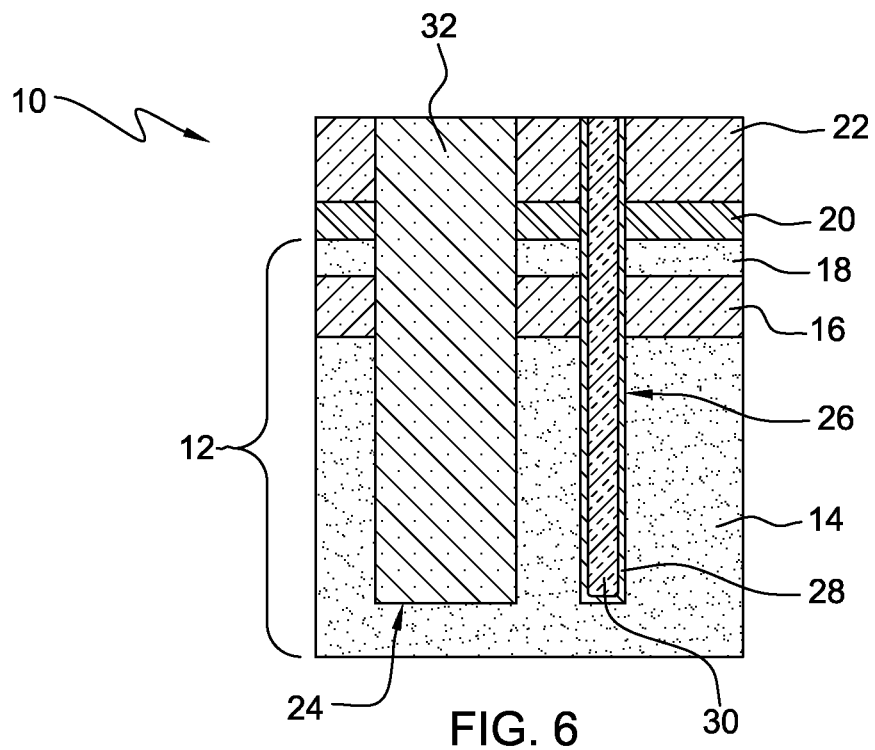

Referring now to FIG. 6, semiconductor structure 10 undergoes a conventional chemical-mechanical polish (CMP) process to planarize the semiconductor structure 10 which removes the oxide fill 32 over the oxide hard mask 22. No stopping point is required for the CMP process as the precise amount of material removed during the CMP process is not critical. During the CMP process, some of the oxide hard mask 22 may be removed. In addition, a small portion of liner 28 and polysilicon 30 in second trench 26 may also be removed.

Figure 7:
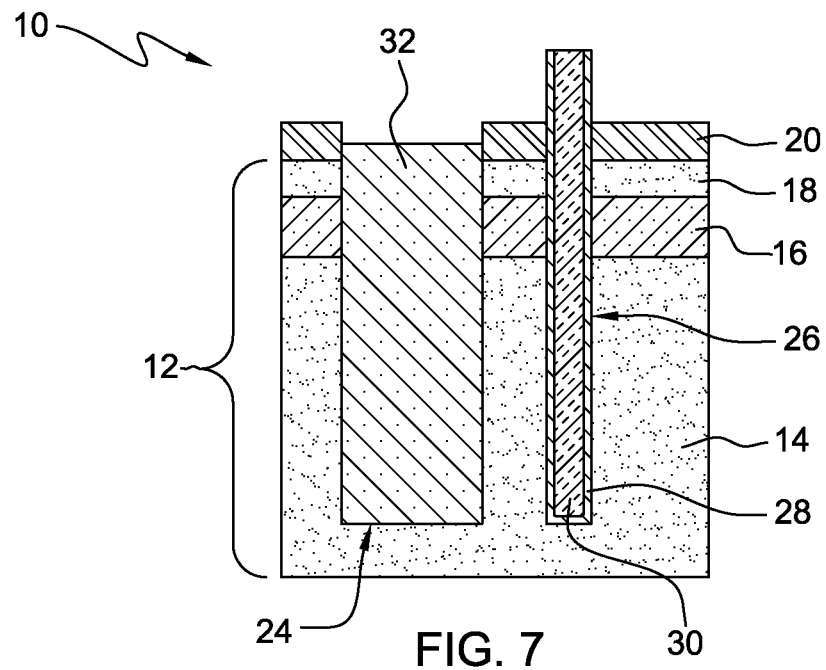

Referring now to FIG. 7, the oxide hard mask 22 is removed by a wet etch, such as hydrofluoric acid, or a dry etch, such as reactive ion etching. As a result, a portion of the liner 28 and polysilicon fill 30 protrudes above the pad nitride layer 20. Oxide fill 32 may also be recessed as a result of the wet etch.

Figure 8:
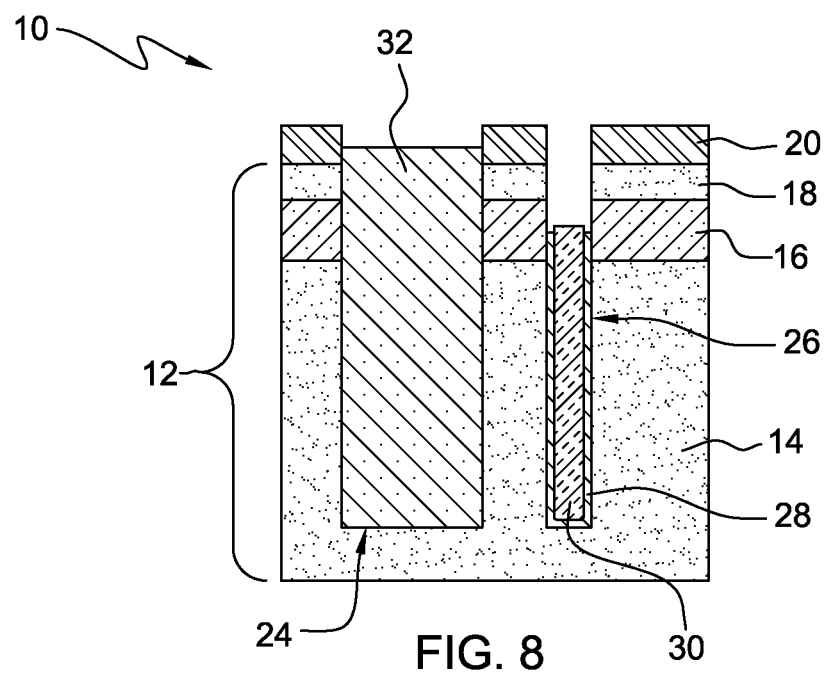

Then, a multi-step etch process is used to remove the portion of the liner 28 and polysilicon fill 30 that protrudes above the pad nitride layer 20 followed by recessing of the polysilicon fill 30 and the liner 28. The multi-step etch process includes (i) etching the high-k outer part of the liner 28 with, for example, an isotropic reactive ion etch, (ii) etching the metal part of the liner 28 with, for example, a wet etchant of sulfuric acid and hydrogen peroxide, (iii) etching of the polysilicon 30 to recess the polysilicon by, for example, isotropic reactive ion etching or nitric acid plus hyrdrofluoric acid, (iv) etching of the metal part of the liner 28 with, for example, a wet etchant of sulfuric acid and hydrogen peroxide, and lastly, (v) etching the high-k outer part of the liner 28 with, for example, an isotropic reactive ion etch. The resultant structure is shown in FIG. 8. It is noted that the liner 28 and polysilicon 30 may only extend into the buried oxide layer 16 now.

Figure 9:
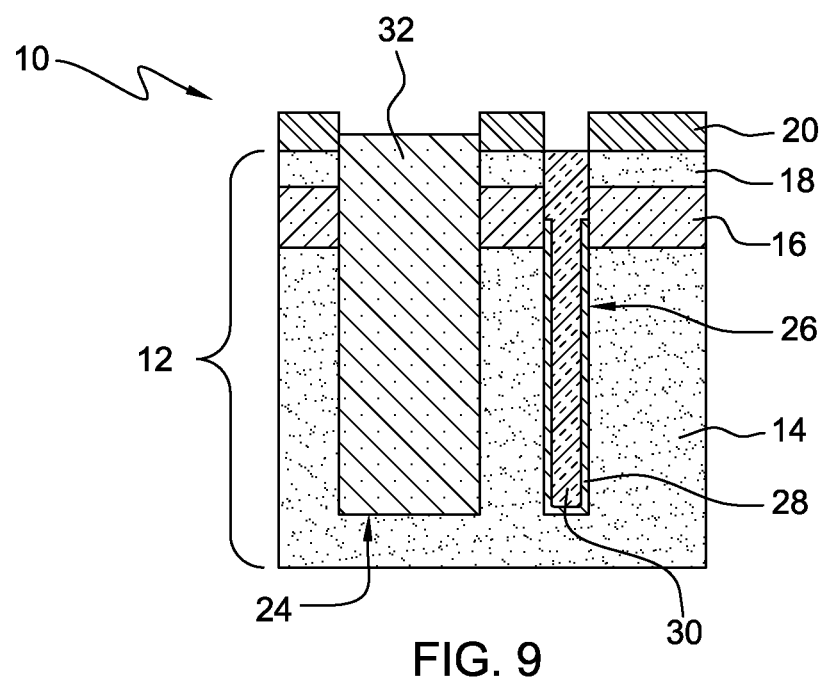

Referring now to FIG. 9, additional polysilicon 30 is deposited by, for example, chemical vapor deposition into second trench 26 and then recessed by, for example, isotropic reactive ion etching.

It should be understood that the process details described above, such as deposition methods, material removal methods and materials, may vary depending on the materials utilized for the optional liner, first fill material and second fill material. In general, the process for forming a semiconductor device structure in a semiconductor layer may include forming a first trench of a first width and a second trench of a second width in the semiconductor layer. A next process step may include depositing a layer of first material which conforms to a wall of the first trench but does not fill it and which fills the second trench. A further process step may include removing the first material from the first trench with the first material remaining in the second trench. Another process step may include depositing a second material into and filling the first trench and over a top of the first material in the second trench. A last process step may include uniformly removing the second material from the top of the first material in the second trench. The foregoing process results in the first trench being filled with the second material and the second trench being filled with the first material such that the first material is different from the second material.

In one exemplary embodiment, the narrow and wide deep trench structures are formed as described above and then logic and/or memory devices may be fabricated followed by further conventional semiconductor processing. In another exemplary embodiment, the logic and/or memory devices may be fabricated first followed by the formation of the narrow and wide deep trenches as described above followed by further conventional semiconductor processing.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a semiconductor device structure in a semiconductor layer comprising:
    forming a first trench of a first width and a second trench of a second width in the semiconductor layer;
    depositing a conformal liner in the first trench and the second trench, the conformal liner conforming to a wall of the first trench and a wall of the second trench;
    depositing a layer of first material on the conformal liner which conforms to the wall of the first trench but does not fill it and which fills the second trench;
    removing the first material completely from the first trench while simultaneously recessing the first material in the second trench, the first material remaining in the second trench except for a recess formed at a top of the second trench as a result of the recessing the first material;
    removing the conformal liner completely from the first trench while simultaneously partially removing the conformal liner from the second trench within the recess;
    depositing a second material into and filling the first trench and over a top of the first material in the second trench to fill the recess in the second trench with the first material; and
    uniformly removing the second material from the top of the first material in the second trench, wherein the first trench is filled with the second material and the second trench is filled with the first material and wherein the first material is different from the second material.

2. The method of claim 1 wherein the first width is larger than the second width.

3. The method of claim 1 wherein the first width is larger than the second width by at least ten percent (10%).

4. The method of claim 1 wherein depositing a layer of first material is by a chemical vapor deposition process.

5. The method of claim 1 wherein depositing a second material is by a chemical vapor deposition process.

6. The method of claim 1 wherein the first trench has a depth and the second trench has a depth such that the first trench depth equals the second trench depth.

7. The method of claim 1 wherein depositing a layer of first material is by a chemical vapor deposition process and wherein depositing a second material is by a chemical vapor deposition process.

8. The method of claim 7 wherein the first material is selected from the group consisting of oxides, metals and polysilicon and the second material is selected from the group consisting of oxide, metals and polysilicon.

9. The method of claim 1 wherein the conformal liner is of a material different from the first and second materials.

10. A method of forming a semiconductor device structure in a semiconductor layer comprising:
    forming a first trench of a first width and a second trench of a second width in the semiconductor layer;
    depositing a conformal liner in the first trench and the second trench, the conformal liner conforming to a wall of the first trench and a wall of the second trench;
    depositing a layer of polysilicon on the conformal liner which conforms to the wall of the first trench but does not fill it and which fills the second trench;
    removing the polysilicon completely from the first trench while simultaneously recessing the first material in the second trench, the polysilicon remaining in the second trench except for a recess formed at a top of the second trench as a result of the recessing the first material;
    removing the conformal liner completely from the first trench while simultaneously partially removing the conformal liner from the second trench within the recess;

depositing oxide into and filling the first trench and over a top of the polysilicon in the second trench to fill the recess in the second trench with the oxide; and uniformly removing the oxide from the top of the polysilicon in the second trench, wherein the first trench is filled with an oxide and the second trench is filled with polysilicon.

11. The method of claim 10 wherein the first width is larger than the second width.

12. The method of claim 10 wherein the first width is larger than the second width by at least ten percent (10%).

13. The method of claim 10 wherein the first trench has a depth and the second trench has a depth such that the first trench depth equals the second trench depth.

14. The method of claim 10 wherein depositing a layer of polysilicon is by a chemical vapor deposition process and wherein depositing oxide is by a chemical vapor deposition process.

15. A method of forming a semiconductor device structure in a semiconductor layer comprising:

forming a semiconductor substrate having a semiconductor layer, a pad nitride layer over the semiconductor layer and an oxide hard mask over the pad nitride layer;

forming a first trench of a first width and a second trench of a second width through the oxide hard mask and pad nitride layer and penetrating at least into the semiconductor layer;

depositing a conformal liner in the first trench and the second trench, the conformal liner conforming to a wall of the first trench and a wall of the second trench;

depositing a layer of polysilicon over the oxide hard mask and into the first trench and second trench, the polysilicon conforming to the wall of the first trench but not filling it and filling the second trench;

removing the polysilicon from the first trench, the polysilicon remaining in the second trench;

removing the conformal liner completely from the first trench;

depositing oxide directly over the oxide hard mask and into and filling the first trench and over a top of the second trench;

uniformly removing the deposited oxide and stopping on the top of the polysilicon in the second trench and stopping on the oxide hard mask, wherein the first trench is filled with an oxide and the second trench is filled with polysilicon; and further comprising in the following order:

etching the oxide hard mask to expose a portion of a side of the polysilicon in the second trench;

recessing the polysilicon to below the pad nitride layer.

16. The method of claim 15 wherein the semiconductor substrate is a semiconductor on insulator substrate comprising a bulk semiconductor having a buried oxide layer and the semiconductor layer and wherein the first trench and second trench extend into the bulk semiconductor.

17. The method of claim 15 wherein the first width is larger than the second width.

18. The method of claim 15 wherein the first width is larger than the second width by at least ten percent (10%).

19. The method of claim 15 wherein the first trench has a depth and the second trench has a depth such that the first trench depth equals the second trench depth.

20. A method of forming a semiconductor device structure in a semiconductor layer comprising:

forming a semiconductor substrate having a semiconductor layer, a pad nitride layer over the semiconductor layer and an oxide hard mask over the pad nitride layer;

forming a first trench of a first width and a second trench of a second width through the oxide hard mask and pad nitride layer and penetrating at least into the semiconductor layer;

depositing a conformal liner in the first trench and second trench;

depositing a layer of polysilicon over the oxide hard mask and into the first trench and second trench, the polysilicon conforming to the liner of the first trench but not filling it and filling the second trench;

removing the polysilicon from the first trench, the polysilicon remaining in the second trench;

removing the liner completely from the first trench;

depositing oxide directly over the oxide hard mask and into and filling the first trench and over a top of the second trench;

uniformly removing the deposited oxide and stopping on the top of the polysilicon in the second trench and stopping on the oxide hard mask, wherein the first trench is filled with an oxide and the second trench is filled with polysilicon; and further comprising in the following order:

etching the oxide hard mask to expose a portion of the liner and polysilicon from the second trench;

recessing the liner and polysilicon to below the pad nitride layer.

21. The method of claim 20 wherein the semiconductor substrate is a semiconductor on insulator substrate comprising a bulk semiconductor having a buried oxide layer and the semiconductor layer and wherein the first trench and second trench extend into the bulk semiconductor.

22. The method of claim 20 wherein the first width is larger than the second width.

23. The method of claim 20 wherein the first trench has a depth and the second trench has a depth such that the first trench depth equals the second trench depth.

24. The method of claim 15 comprising:

maintaining the pad nitride layer on the semiconductor substrate; and adding additional polysilicon only to the second trench.

25. The method of claim 20 comprising:

maintaining the pad nitride layer on the semiconductor substrate; and adding additional polysilicon only to the second trench.

* * * * *